United States Patent
Farkas et al.

(10) Patent No.: US 7,803,719 B2
(45) Date of Patent: Sep. 28, 2010

(54) SEMICONDUCTOR DEVICE INCLUDING A COUPLED DIELECTRIC LAYER AND METAL LAYER, METHOD OF FABRICATION THEREOF, AND PASSIVATING COUPLING MATERIAL COMPRISING MULTIPLE ORGANIC COMPONENTS FOR USE IN A SEMICONDUCTOR DEVICE

(75) Inventors: Janos Farkas, Saint Ismier (FR); Maria Luisa Calvo-Munoz, Grenoble (FR); Srdjan Kordic, Eindhoven (NL)

(73) Assignee: Freescale Semiconductor, Inc., Austin, TX (US)

( * ) Notice: Subject to any disclaimer, the term of this patent is extended or adjusted under 35 U.S.C. 154(b) by 87 days.

(21) Appl. No.: 12/280,477

(22) PCT Filed: Feb. 24, 2006

(86) PCT No.: PCT/EP2006/002852

§ 371 (c)(1),
(2), (4) Date: Aug. 22, 2008

(87) PCT Pub. No.: WO2007/095972

PCT Pub. Date: Aug. 30, 2007

(65) Prior Publication Data

US 2009/0115031 A1    May 7, 2009

(51) Int. Cl.
*H01L 21/31* (2006.01)
*H01L 23/58* (2006.01)
(52) U.S. Cl. .................. 438/780; 438/781; 438/790; 257/642; 257/759
(58) Field of Classification Search .................. 438/680, 438/681, 780, 789, 790; 257/642, 643, 759
See application file for complete search history.

(56) References Cited

U.S. PATENT DOCUMENTS

| 2,828,279 | A | 3/1958 | Lewis |
| 4,667,046 | A | 5/1987 | Frey et al. |
| 5,256,480 | A | 10/1993 | Inoue |
| 5,358,743 | A | 10/1994 | Hampden-Smith et al. |
| 5,478,436 | A | 12/1995 | Winebarger et al. |
| 5,614,444 | A | 3/1997 | Farkas et al. |
| 6,110,011 | A | 8/2000 | Somekh et al. |
| 6,143,126 | A | 11/2000 | Stevens |
| 6,245,690 | B1 | 6/2001 | Yau et al. |

(Continued)

FOREIGN PATENT DOCUMENTS

DE    3924222 A1    1/1990

(Continued)

OTHER PUBLICATIONS

U.S. Appl. No. 12/162,173, filed Jul. 25, 2009, entitled "'Universal' Barrier CMP Slurry for Use with Low Dielectric Constant Interlayer Dielectrics".

(Continued)

*Primary Examiner*—Kevin M Picardat

(57) ABSTRACT

A material for passivating a dielectric layer in a semiconductor device has a molecular structure permitting or at least promoting liquid phase metal deposition thereon in a subsequent process step. The contemplated material may be constituted by multiple organic components. A semiconductor device including a layer of the passivating coupling material, and a method of manufacturing such a semiconductor device are also contemplated.

20 Claims, 1 Drawing Sheet

U.S. PATENT DOCUMENTS

| | | |
|---|---|---|
| 6,294,059 B1 | 9/2001 | Hongo et al. |
| 6,352,467 B1 | 3/2002 | Somekh et al. |
| 6,486,061 B1 * | 11/2002 | Xia et al. .................... 438/680 |
| 6,503,834 B1 | 1/2003 | Chen et al. |
| 6,582,767 B1 | 6/2003 | Fukushima et al. |
| 6,589,099 B2 | 7/2003 | Haggart, Jr. et al. |
| 6,616,717 B2 | 9/2003 | Sachan et al. |
| 6,646,348 B1 | 11/2003 | Grumbine et al. |
| 6,660,634 B1 | 12/2003 | Ngo et al. |
| 6,860,944 B2 | 3/2005 | Ivanov et al. |
| 6,924,232 B2 | 8/2005 | Mathew et al. |
| 7,691,756 B2 | 4/2010 | Farkas et al. |
| 2001/0012869 A1 | 8/2001 | Fukushima et al. |
| 2001/0018266 A1 | 8/2001 | Jiang et al. |
| 2002/0023719 A1 | 2/2002 | Epshteyn et al. |
| 2003/0013387 A1 | 1/2003 | Tsai et al. |
| 2003/0049927 A1 | 3/2003 | Tonegawa et al. |
| 2003/0198895 A1 | 10/2003 | Toma et al. |
| 2003/0199162 A1 | 10/2003 | Seki |
| 2004/0020601 A1 | 2/2004 | Zhao et al. |
| 2004/0023515 A1 | 2/2004 | Gracias et al. |
| 2004/0096582 A1 | 5/2004 | Wang et al. |
| 2004/0138489 A1 | 7/2004 | Wang et al. |
| 2004/0224521 A1 | 11/2004 | Flake et al. |
| 2005/0029662 A1 | 2/2005 | Nakano et al. |
| 2005/0048773 A1 | 3/2005 | Mathew et al. |
| 2008/0207005 A1 | 8/2008 | Farkas |

FOREIGN PATENT DOCUMENTS

| | | |
|---|---|---|
| DE | 4020828 A1 | 1/1992 |
| DE | 4234959 C1 | 4/1994 |
| DE | 3924193 C2 | 4/1995 |
| EP | 1077479 A | 2/2001 |
| EP | 1195451 A1 | 4/2002 |
| EP | 1586614 A | 10/2005 |
| JP | 62256804 A | 11/1987 |
| JP | 62296139 A | 12/1987 |
| JP | 63258909 A | 10/1988 |
| JP | 01101308 A | 4/1989 |
| JP | 01141915 A | 6/1989 |
| JP | 01141916 A | 6/1989 |
| JP | 03123785 A | 5/1991 |
| JP | 2005302973 A | 12/2003 |
| WO | 0201621 A2 | 1/2002 |
| WO | 2004041938 A1 | 5/2004 |
| WO | 2006086996 A1 | 8/2006 |
| WO | 2007025565 A1 | 3/2007 |
| WO | 2007025566 A1 | 3/2007 |
| WO | 2007026010 A2 | 3/2007 |

OTHER PUBLICATIONS

U.S. Appl. No. 11/816,036, filed Apr. 8, 2008, entitled "Wafer Cleaning After Via-Etching".

U.S. Appl. No. 12/280,482, filed Dec. 18, 2008, entitled "Integrated System for Semiconductor Substrate Processing Using Liquid Phase Metal Deposition".

U.S. Appl. No. 12/065,190, filed Feb. 28, 2008, entitled "Capping Layer Formation onto a Dual Damescence Interconnect".

Bain, S. et al., "Mechanism of Slanone Extrusion from Alkoxyvinylsilanes," Organometallics, vol. 6, No. 5, 1987, pp. 1136-1138.

Farkas, J. et al., "FTIR Studies of the Adsorption/Desorption Behaviour of Cu Chemical Vapor Deposition Precursors on Silica, IV. Interaction of (1,1,1,5,5,5-Hexafluoroacetylacetonato)(2-Butyn)Copper(I), (HFAC)Cu(VTMS) with Passivated Silica Surfaces and Comparison to Selective CVD of Cu," Journal of the Electrochemical Society, vol. 141, No. 12, Dec. 1994, pp. 3547-3555.

Nitta, S. et al., "Surface Modified Spin-on Xerogel Films as Interlayer Dielectrics," Journal of Vacuum Science and Technology: Part B, AVS/AIP, Melville, New York, NY, vol. 17, No. 1, Jan. 1999, XP000804182, ISSN: 1071-1023, pp. 205-212.

Reidy, R.F. et al., "Supercritical silylation of ashed Si-O-C low-k films to limit changes in critical dimensions," Advanced Metallization Conference 2003, pp. 513-517, XP008053840.

Shacham-Diamand, Y. et al., "Integrated Electroless Metallization for USLI," Electrochimica ACTA (Elecroch, Acta), 1999, vol. 44, pp. 3639-3649.

Steinmetz, M.G. et al., "Solution-Phase Far-UV Photochemistry of Unsaturated Organosilanes: Dehydrosilylation, Dyotropic Rearrangement, and Protodesilylation" Journal of Organic Chemistry, vol. 51, No. 26, 1986, pp. 5051-5063.

Szabo, K. et al., "Monofunctional (Dimethylamino) Silane as Silylating Agent," Helvetica Chimica Acta (Helv.Chimi. Acta), Dec. 19, 1984, vol. 67 (8), pp. 2128-2142.

* cited by examiner

SEMICONDUCTOR DEVICE INCLUDING A COUPLED DIELECTRIC LAYER AND METAL LAYER, METHOD OF FABRICATION THEREOF, AND PASSIVATING COUPLING MATERIAL COMPRISING MULTIPLE ORGANIC COMPONENTS FOR USE IN A SEMICONDUCTOR DEVICE

CROSS-REFERENCE TO RELATED APPLICATION

The present application is related to co-pending U.S. patent application Ser. No. 12/280,482, entitled "INTEGRATED SYSTEM FOR SEMICONDUCTOR SUBSTRATE PROCESSING USING LIQUID PHASE METAL DEPOSITION" filed on Dec. 18, 2008.

FIELD OF THE INVENTION

The present invention relates to a passivating coupling material, a semiconductor device in which such a passivating coupling material is used, and a method of fabricating such a semiconductor device.

BACKGROUND OF THE INVENTION

As the size of features of integrated circuits decreases, it is increasingly important to reduce the resistance-capacitance delay (RC delay) attributable to interconnects used in such circuits. One approach is to use interconnects having a reduced dielectric constant (k), which can be obtained, for example, by using appropriate low-k materials. In one example, carbonated silicon dioxide (SiOC) films are conventionally known in 90-120 nm technology nodes. A further known approach is to further reduce the dielectric constant by using porous carbonated silicon dioxide films.

The term "carbonated silicon dioxide films" and the corresponding formula "SiOC" are used to designate silicon dioxide films including carbon therein (e.g., by using $CH_3SiH_3$ in place of the $SiH_4$ that is often used as a precursor in CVD deposition of a silicon dioxide layer). Such films are sometimes also referred to in the art as carbon-doped silicon dioxide films.

Carbonated silicon dioxide films are being developed by several vendors, using chemical vapor deposition or spin-on coating techniques. Several vendors are currently developing CVD-deposited SiOC films using a "porogen" approach. With this technology, the porogens are built into a dielectric film and are degassed during the post-treatment, leaving pores in the film. Applied Materials (Black Diamond IIx; III), Novellus systems (ELK Coral), Trikon (Orion), and ASM are amongst the companies working on this approach. Suppliers of spin-on porous dielectric materials include Dow Chemicals (SiLK), Rohm & Haas (Zirkon), and JSR.

However, it is known in the art that a silicon oxide-containing material (like a carbonated silicon dioxide) has a substantial population of surface hydroxyl (sometimes referred to herein as "silanol") groups on its surface. These groups have a strong tendency to take up water because they are highly polarized. They are generated by the breakup of four- and six-member bulk siloxane (Si—O—Si) bridges at the surface of the material. These siloxane structures at the material surface have an uncompensated electric potential and so can be considered to be "strained". They react readily with ambient moisture to form the surface hydroxyl groups. If the silicon oxide-containing material is porous, the surface hydroxyls and the adsorbed water molecules tend to propagate into the bulk of the material, causing, for reasons known in the art, an increase in the dielectric constant and reduced film reliability.

A comparable effect occurs in materials such as metal oxides because the metal ion-oxide bonds located at the surface of the material have an uncompensated electric potential. This likewise leads to a ready reaction with ambient moisture so as to form surface hydroxyl groups. Once again, if the material is porous, the surface hydroxyls and adsorbed water molecules may propagate into the bulk of the material and lead to an unwanted increase in dielectric constant.

As mentioned above, carbonated silicon oxide is often used as a porous dielectric material. Its carbon-rich surface has relatively fewer strained oxide bonds. Thus, there is a reduced population of surface hydroxyls at the surface of the material at the outset.

However, the tendency for water uptake is still quite high in carbon-containing porous dielectric materials after a dry etch process. The oxidizing plasma reduces the carbon content at the surface of the material and therefore increases the population of surface hydroxyls. The dielectric constant k therefore tends to increase after dry etching, so the k value of the film must be "restored." A conventional example restoring the dielectric constant uses a supercritical $CO_2$ treatment with hexamethyldisilazane (HMDS).

Besides negatively affecting the dielectric constant of the porous dielectric layer, adsorbed water can also cause problems during subsequent stages in the manufacture of the circuit, notably degassing and reliability problems.

For the reasons described above, it is important to prevent water adsorption and uptake if porous dielectric materials are used to form interconnects. Moreover, moisture uptake in a porous dielectric could possibly corrode metallic barrier layers subsequently formed thereon.

Some known approaches to prevent or impede moisture uptake by porous dielectric materials during manufacture and use of a semiconductor integrated circuit include "dielectric restoration" as mentioned hereinabove, as well as "pore sealing."

Pore sealing involves prevention of access to the pores in the porous material, for example, by modifying the surface of the porous material (e.g. using an organosilane treatment). Alternatively, a thin dielectric film may be deposited on the surface of the porous dielectric layer. More particularly, the thin dielectric film can be applied to the porous dielectric layer after vias have been etched therein.

Patent Application No. PCT/EP2005/001510 (filed Feb. 15, 2005) describes a technique for cleaning via and trench structures after an etching step, using liquid cleaning agents. Patent Application No. PCT/EP2005/010688 (filed Sep. 1, 2005) describes a composition for passivating a porous, low dielectric constant dielectric layer while simultaneously providing reaction sites promoting the electroless metal layer deposition thereon.

SUMMARY OF THE INVENTION

In view of the foregoing, the present invention provides a passivating coupling material, a semiconductor device in which such a passivating coupling material is used, and a method of fabricating such a semiconductor device, as set forth in the claims appended hereto.

DETAILED DESCRIPTION OF THE PREFERRED EMBODIMENTS

Figure 1:
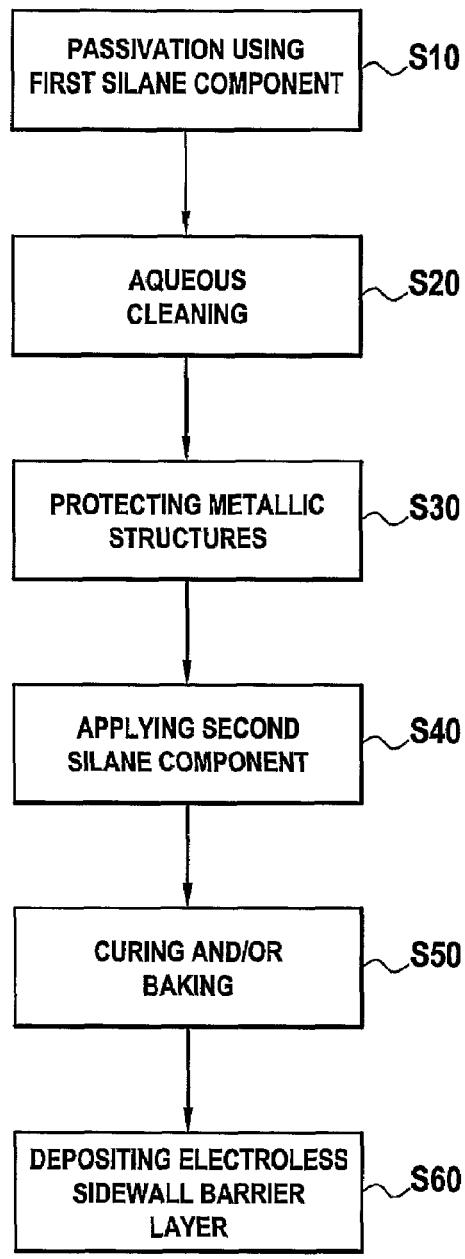
FIG. 1 is a flow chart illustrating a method of manufacturing a semiconductor device in accordance with an embodiment of the invention, given by way of example.

Some preferred embodiments of the present invention are described hereinbelow.

It is noted that the description hereinbelow refers, strictly by way of example, to a porous SiOC dielectric layer formed on a semiconductor substrate. However, the present invention is fully applicable to any porous dielectric layer that is prone to have surface hydroxyls thereon according to the foregoing explanation, including also, for example and without limitation, TEOS (tetraethylorthosilicate) and FTEOS (fluorine-doped tetraethylorthosilicate) dielectric layers.

Moreover, it is also expressly noted that the present invention is also useful with respect to non-porous dielectric layers to the extent that it still functions at least to promote metal nucleation to support liquid phase metal layer formation.

The mention of a "semiconductor substrate" herein includes and encompasses, without limitation, semiconductor wafers, partially cut groups of semiconductor dice, and individual semiconductor chips. The mention of structures or layers or the like formed "on" a semiconductor substrate may include the presence of the structure or layer or the like directly or indirectly on the surface of the semiconductor substrate.

For the purposes of informative illustration therefore, the description set forth hereinbelow describes the function of the passivating coupling material for both passivation (such as pore sealing) and for coupling (that is, promoting metal layer formation). However, the passivating coupling material can also be used for one function or the other alone such that reference could be made to a passivating layer or a coupling layer, as well as the material therefore.

To illustrate and further explain the present invention, the general characteristics of the passivating coupling material will be first described. Thereafter, the use of multiple organic components according to the present invention to constitute such a passivating coupling material will be explained.

In general, a passivating coupling material as relates to the present invention is formed on a porous dielectric layer surface so as to react with the surface hydroxyls which are present thereon, as discussed hereinabove. This reaction between the passivating coupling material and the surface hydroxyls effectively attaches one or more shielding groups present in the passivating coupling material to the surface of the porous dielectric layer. The gaps between the thusly attached shielding groups are too small to allow water or molecules from liquid phase contact to reach the surface of the porous dielectric material. The attached shielding groups provide steric shielding and block or at least hinder the passage of moisture.

The presence of shielding groups may be considered optional in some circumstances. For example, the dielectric layer being passivated may be less prone or may even be essentially not prone to adsorb and/or take up moisture, such as non-porous layers.

On the other hand, certain other functional groups of the passivating coupling material also provide or present metal nucleation sites that facilitate and promote the formation of a metal layer (particularly, for electroless formation of a metal layer), in comparison to metal deposition thereon without the presence of the passivating coupling layer.

A variety of materials can be used to passivate the porous dielectric material according to the present invention. Generally, an appropriate passivating coupling material is a material that:

includes at least one functional group that can react with surface hydroxyls present on the surface of the porous dielectric material, includes at least one second functional group (i.e., a ligand) having an electron donor functionality to provide a reactive site (more specifically, a metal nucleation site) on the passivated surface for subsequent metallization, desirably but not necessarily includes at least two silicon atoms in the molecular backbone of its polymeric structure for thermally stabilizing the passivating coupling material, especially during subsequent relatively high temperature processing steps, and may include a plurality of organic shielding groups, which form at least one, and preferably at least two, shielding layers above the surface of the porous dielectric layer for blocking moisture uptake.

In a particular case, the passivating coupling material (or the multiple organic components constituting the passivating coupling material according to the present invention) are soluble and the respective functional group(s) thereof has/have a fast reaction speed with surface hydroxyls, as explained below, in comparison with a rate of water uptake into the porous dielectric layer.

The passivating coupling material (and the components thereof) could also be usefully soluble in alcohols (such as, for example, ethanol or isopropanol) or in another organic solvent like toluene.

The passivating coupling material may include at least one functional group which can be hydrolyzed in water.

An appropriate passivating coupling material is, for example, an organosilane according to the general formula

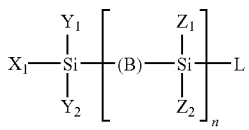

in which:

n is an integer equal to or greater than 1 (i.e., 1, 2, 3, 4, 5, 6, 7 . . . ), each Si is a silicon atom;

$X_1$ is a functional group able to react with a surface hydroxyl site of the porous dielectric material.

$Y_1$ is either:
$X_2$, which is a further functional group able to react with a surface hydroxyl site of the porous dielectric material,
H, which is a hydrogen atom, or
$R_1$, which is an organic apolar group;

$Y_2$ is either:
$X_3$, which is a further functional group able to react with a surface hydroxyl site of the porous dielectric material,
H, which is a hydrogen atom, or
$R_2$, which is an organic apolar group B, the presence of which is optional, is a bridging group, $Z_1$ is either:
$R_3$, which is an organic apolar group,
H, which is a hydrogen atom, or
$L_1$, which is a ligand having an electron donor functionality and is able to act as a metal nucleation site, $Z_2$ is either:
$R_4$, which is an organic apolar group,
H, which is a hydrogen atom, or
$L_2$, which is a ligand having an electron donor functionality and is able to act as a metal nucleation site, and L is a ligand having an electron donor functionality and is able to act as a metal nucleation site.

In general, the strength of the bond between the passivating coupling material and the porous dielectric material, and the speed at which the passivating coupling material reacts with the surface hydroxyls on the porous dielectric material is believed to depend on what functional groups are present in the passivating coupling material composition, and on the number of the silicon groups in the passivating coupling material.

Organosilanes form relatively stronger bonds to the surface than hydrocarbon chains that do not contain silicon, and therefore can provide a more stable protection for the porous dielectric layer surface. Also, the presence of at least one, and desirably at least two, silicon atoms in the main chain ("backbone") of the polymeric molecule as described herein makes the molecule more thermally stable, particularly in view of the elevated temperatures encountered in subsequent process steps.

For example, after liquid phase metallization, a subsequent dielectric layer deposition and cure may entail temperatures of, for example, about 350° C. By way of comparison, a molecule having carbon (for example, aliphatic or aromatic carbon) in the backbone would likely oxidize at comparable temperatures.

In the foregoing molecule, at least one of the organic apolar groups $R_1$, $R_2$, $R_3$, and $R_4$ is present to provide steric shielding from the hydroxyl groups and adsorbed water molecules in the form of at least one, and preferably at least two, steric shielding layers according to their connection to the respective Si atoms.

Studies in other fields suggest that, when properly chosen, such organic group layers could be efficient to sterically shield non-porous dielectric surfaces from precursors (such as metalorganic compounds), see, for example, J. Farkas et al., *J. Electrochem. Soc.* 141, 3547 (1994). With porous materials it could be expected that the size of the shielding groups R should be proportional to the size of pores.

The effect of organic apolar groups R on steric shielding by organosilanes has been studied in the field of high-pressure liquid gas chromatography column treatment. See, for example, K. Szabo et al, *Helv. Chimi. Acta.* vol. 67, p. 2128 (1984). The Farkas et al. paper showed that an organic layer less than about 25 Angstroms thick can be efficient for sterically shielding a surface from water penetration, even at elevated temperatures. When using a passivation material to shield a porous dielectric surface, the length of the hydrocarbon chain can be easily adjusted to optimize the efficiency of steric shielding to the pore size of the dielectric.

According to a particular example, the organic apolar group(s) $R_1$, $R_2$, $R_3$, and/or $R_4$ may be an optionally halogenated $C_1$ to $C_{10}$ alkyl, $C_2$ to $C_{10}$ alkenyl, or $C_6$ to $C_{10}$ aryl or aralkyl group, which is/are preferably selected from: methyl, ethyl, propyl, butyl, phenyl, pentafluorophenyl, 1,1,2-trimethylpropyl(thexyl), and allyl.

That is, $R_1$ and/or $R_2$, if present as $Y_1$ and/or $Y_2$, respectively, will form a first steric shielding layer; and $R_3$ and/or $R_4$, if present as $Z_1$ and/or $Z_2$, respectively, forms a second, third, fourth, fifth, etc., steric shielding layer, depending on the number n of monomers present in the chain.

Functional groups $X_1$, $X_2$, and $X_3$ should have a structure such that they are able to react with the surface hydroxyl sites of the porous dielectric material and attach one of more shielding layers in the passivating coupling material to the surface of the porous dielectric material. More particularly, the X functional group reacts by the reactive elimination of the surface hydroxyl.

Some examples of appropriate functional groups in this regard include, without limitation, -chloride, -bromide, iodine, acryloxy-, alkoxy-, acetamido, acetyl-, allyl-, amino-, cyano-, epoxy-, imidazolyl, mercapto-, methanosulfonato-, sulfonato-, trifluoroacetamido, and urea-containing groups The ligand L (as well as ligand $L_1$ and/or $L_2$, if present) should have an electron donor functionality, and, once the molecule is attached to the surface of the porous dielectric material, the ligand(s) form a reaction site for metal nucleation during a subsequent liquid phase metallization process.

Ligands appropriate to the present invention include, without limitation, vinyl, allyl, 2-butynyl, cyano, cyclooctadienyl, cyclopentadienyl, phosphinyl, alkylphosphinyl, sulfonato, and amine groups.

In certain instances, the functional groups and the ligands could be the same mono-, bi-, and tri-functional amines (which would form strong interactions with both the porous dielectric thereunder and the metal layers subsequently formed thereon).

Several examples of passivating coupling material compositions will be shown hereafter, without limitation. It will be appreciated that the example compositions shown below can be made longer or shorter according to the number of n monomers that are present therein. The index n is most generally an integer of 1 or greater. More preferably, n is an integer between 1 and 30, inclusive. Most preferably, n is an integer between 1 and 18, inclusive, i.e., 1, 2, 3, 4, 5, 6 . . . 17, or 18.

Also, as described later, the passivating coupling material may be made of a plurality of organic "components" that can be chemically reacted together so as to essentially assemble a passivating coupling material composition in accordance with the overall characteristics of such a material described here.

The bridging group B, if present, can be, for example, a divalent bridging group (such as oxygen or sulfur), a trivalent bridging group (such as nitrogen or phosphorus), or a tetravalent bridging group (such as carbon or silicon), and may be, more particularly, silylene and unsaturated aromatic carbon-containing groups such as m-phenylene, p-phenylene, and p,p'-diphenyl ether. The bridging group B, when present, may further improve the thermal stability of the passivating coupling material molecule.

EXAMPLE 1

Methoxy-tetramethyl-vinyl-disilane

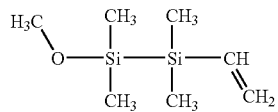

in which the $X_1$ functional group is $H_3CO$-(methoxy) group; the $Y_1$, $Y_2$, $Z_1$, $Z_2$ functional groups are —$CH_3$ (methyl) organic shielding groups; B is absent; and the ligand L is a —CH=$CH_2$ vinyl group.

EXAMPLE 2

Trimethoxy-dimethyl-vinyl-disilane

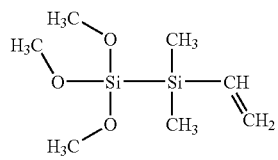

in which the $X_1$, $Y_1$, and $Y_2$ functional groups are $H_3CO$-(methoxy groups); the $Z_1$ and $Z_2$ functional groups are $CH_3$ methyl organic shielding groups; B is absent; and the ligand L is a —CH=$CH_2$ vinyl group.

EXAMPLE 3

Vinyltetramethylmethoxydisiloxane (Bridging Group B Present)

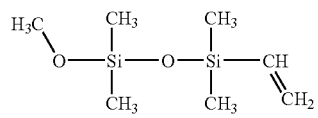

in which the $X_1$ functional group is a $H_3CO$-(methoxy) group; the $Y_1$, $Y_2$, $Z_1$, $Z_2$ functional groups are —$CH_3$ (methyl) organic shielding groups; the bridging group B is oxygen (forming a disiloxane compound); and the ligand L is a —C=$CH_2$ vinyl group.

The addition of a bridging group B (such as oxygen in this example) can significantly affect the thermal stability of the coupling layer. Silylene and unsaturated carbon-containing carbene groups such as m-phenylene, p-phenylene, and p,p'-diphenyl ether are additional examples of bridging groups that can be used to further improve the thermal stability of the passivating coupling material molecule.

EXAMPLE 4

Methoxy-tetramethyl-butyl-disilane(Alternative Ligand)

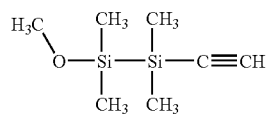

in which the $X_1$ functional group is a $H_3CO$-(methoxy) group; the $Y_1$, $Y_2$, $Z_1$, $Z_2$ functional groups are —$CH_3$ (methyl) organic shielding groups; the bridging group B is absent; and the ligand L is a —C≡CH acetylenyl group.

EXAMPLE 5

Methoxy-hexamethyl-vinyl-trisilane (Alternative Molecule Length)

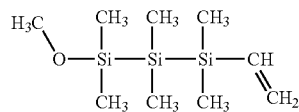

in which the $X_1$ functional group is a $H_3CO$-(methoxy) group; $Y_1$, $Y_2$, $Z_1$, $Z_2$ functional groups are —$CH_3$ (methyl) organic shielding groups; the bridging group B is absent; and the ligand L is a —CH=$CH_2$ (vinyl) group.

The passivating coupling material can in general be applied on the surface of a porous dielectric material in accordance with known methods for applying an organic molecule or compound including, generally and without limitation, gas phase, liquid phase, or spray chamber application.

However, liquid phase application, if used, must address the above-noted issues of moisture adsorption, particularly in the presence of a porous material thereunder. In particular, the passivating coupling material (or the components thereof) is typically diluted in water or another organic solvent like alcohol (and possibly in combination to further increase the solubility of the polymer). Also, some of the noted examples of functional groups suitable for the present invention can be hydrolyzed. Liquid phase application can be performed, for example, at temperatures between about 25° C. and 80° C. with process times between about 30 s to 10 min.

Because the use of an aqueous solution containing the passivating coupling material to deposit a passivating coupling layer over a dielectric layer is contemplated, the reaction speed between the passivating coupling material and surface hydroxyl groups formed on the surface of the porous dielectric layer is preferably sufficiently fast that the reaction takes places before any appreciable uptake of moisture from the aqueous solvent occurs. In other words, the reaction desirably should be fast enough to sterically shield the porous dielectric layer before the dielectric layer starts to significantly adsorb water from the solvent.

In a particular example of liquid application of the passivating coupling material, it is known that polymeric residues tend to form on the semiconductor wafer during fabrication, particularly, but not necessarily only, because of chemical reaction between hydrocarbon etching gases and the substrate material during a preceding etching step. Thus, the application of the passivating coupling material as described above can be impeded by the presence of regions covered by such residues.

Thus, the passivating coupling material could be combined with an aqueous cleaning composition appropriate for removing the polymeric residues. As mentioned above, the speed of the reaction between the passivating coupling material and surface hydroxyl groups on the surface of the porous dielectric material should be fast enough that the reaction essentially occurs as soon as the residues are removed by the cleaning composition so that moisture intake can be substantially avoided.

For example, if the passivating coupling material is a water-soluble organosilane, it can be mixed with the cleaning fluid(s) ahead of application thereof to the wafer. However, if the passivating coupling material consists of an organosilane which is traditionally considered not to be water-soluble when mixed with water, notably because of its short "pot" life (i.e., shelf life), it can be still be used. More particularly, if the organosilane has a short pot life when mixed with water, the organosilane and the cleaning fluid(s) can mixed at, or in the immediate vicinity of, the cleaning tool (i.e. just before application to the wafer).

A passivating process using a passivating coupling material as described above may include following parameters:

the applied cleaning mixture is a soluble organosilane according to the description herein, mixed with an organic acid, or highly diluted aqueous HF, or a salt thereof), and optionally includes a chelating agent and/or surfactant process temperature=25-80° C., and process time=30 s to 10 min After the residual polymers and/or metallic residues are removed, the porous dielectric material is sealed by the passivating coupling layer.

Additional complexing or chelating agents may be used in order to remove metallic species. These reagents should be added into the solution, so as to be able to be processed in a common series of steps. Common complexing agents include ethylenediaminetetraacetic acid (EDTA) and its derivatives and organic acids.

Similarly, a wide variety of surfactants can be included in the solution. For example, it may be advantageous to use block co-polymers built from blocks of poly(ethyleneoxide) and poly(propyleneoxide) as a surfactant. These two groups are efficiently absorbing on both hydrophobic and hydrophilic surfaces, and the length and ratio of each group present in the block co-polymer can easily be tailored to the application.

Instead of liquid deposition using an aqueous solution, the passivating coupling material could be applied in gas phase using a carrier gas like nitrogen or argon combined with the material. Gas phase application can be performed between about 150° C. and about 300° C.

Another possible approach to avoid the difficulties of using an aqueous solution application is to use a spray application in a predetermined environment, particularly in an inert environment. The inert environment may for example be argon, nitrogen, or carbon dioxide, with, for example, a humidity of less than about 1%. The inert atmosphere may be at ambient pressure.

Once the porous dielectric material is appropriately passivated with the passivating coupling material of the present invention, metallization can be performed thereafter in liquid phase starting with an electroless deposition (as known in the art, for example, from Shacham-Diamand, *Electroch. Acta*, vol. 44 (1999), 3639). After deposition of a barrier/seed layer in this fashion, a copper film can be deposited thereon by conventional electrodeposition, as is known in the field of semiconductor manufacture.

Figure 2:
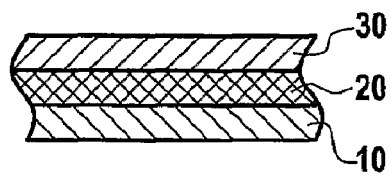
FIG. 2 is a fragmentary cross-sectional view of a semiconductor device in accordance with an embodiment of the invention, given by way of example.

FIG. 2 is a fragmentary view of a semiconductor device in which a passivating coupling layer 20 is formed on a dielectric layer 10 (which is in turn formed on a predetermined substrate (not shown)), and a metallic seed layer 30 is formed on the passivating coupling layer 20.

The above-described optional presence of multiple Si atoms in the backbone of the passivating coupling material, plus the optional presence of a bridging group B, increases the thermal stability of the passivating coupling material such that it can tolerate the temperatures associated with subsequent high-temperature manufacturing steps. In contrast, subsequent thermal decomposition of the shielding groups, if any, can be acceptable because their steric shielding function is no longer needed at that point.

In addition, the one or more ligands presented have an electron donor functionality and provide nucleation sites for the subsequently deposited metal. The fact that $Z_3$ and/or $Z_4$ can additionally be corresponding ligands further enhances the formation of a metal layer by presenting additional nucleation sites.

The ligands provided in the passivating coupling material according to the present invention are meant to provide metal nucleation sites in order to promote or facilitate metal layer formation. However, the ligands may in certain situations tend to be reactive with other metallic structures in a semiconductor device, such as copper metal exposed in etched vias, or metallic barrier layers in the semiconductor device (such as, for example, a cobalt or nickel alloy-based self-aligned barrier layer, as is known in the art).

A problem could arise if, for example, the ligands reacted with, for example, a copper metal structure in an exposed via. One possible result is that the functional groups could still react with surface hydroxyls on the dielectric (as intended), but this would cause, in essence, the both "ends" of the polymer to be attached to the dielectric layer. Another undesirable possibility is that the functional groups X might simply remain unattached, such that the polymer is, in a sense, inverted from its intended orientation. In either case, the passivating coupling material would present a reduced ability to promote metal layer deposition because of the reduction in available ligands acting as nucleation sites.

Accordingly, it may be desirable to formulate the passivating coupling material to reduce or avoid such interaction with other metallic structures forming part of the semiconductor device. Alternatively, some additional processing steps could be implemented in order to render the metal structures relatively insensitive to the passivating coupling material.

With respect to the latter possibility, the surface of a copper metal structure could be treated (i.e., protectively covered with) with a chemically appropriate organic amine. This modification of the copper metal surface can give rise to chemical bonds with the passivating coupling material which are relatively weaker than those between the passivating coupling material and the dielectric material. After the passivating coupling material has been thereafter deposited, a subsequent degassing step (using, for example, a thermal treatment) can be applied to remove any passivating coupling material from the copper metal areas. This removal is facilitated by the above-mentioned weak bonds created by the pretreatment of the copper metal surface.

Thereafter, in either case, a liquid phase metal deposition step can be performed in accordance with the foregoing description by seeding the nucleation sites (i.e., the ligands) presented by the passivating coupling material as described and claimed herein using liquid metal precursors or liquid metal salts, in a manner well known in the field of metal deposition. Alternatively, a gas phase metal precursor could be used.

Yet another possible approach to depositing the passivating coupling material is to use multiple (i.e., at least two) process steps to deposit a sequence of organic components that are reacted together to obtain the overall composition. Doing so can, in particular, increase the range of silanes that can be used. The organic components can be, but are not necessarily, polymeric components.

For example, in a first process step of a multi-step process, the porous dielectric surface is reacted with a first dipodal silane component. The silane reacts with the surface hydroxyls on the porous dielectric surface (in the manner described above), and seals the underlaying porosity while presenting a hydrolizable functional group. Preferably, the reaction is carried out in a controlled atmosphere like nitrogen or argon to increase the range of usable silanes. In the absence of moisture and oxygen, an aggressive sylilating agent (e.g., trifluorosulfonates, aminosilanes, etc.) can be applied.

An aqueous via-clean step can be then optionally applied, whereby the second pole of the silane is hydrolyzed so as to terminate with a silanol (i.e., a surface hydroxyl) group. These are the initiating and reactive sites for the second functionalization step.

A significantly broader selection of silane reagents can be used in a second step to couple electron donor ligands to the silanol groups. As before, the electron donors are nucleating sites for subsequent liquid phase metal barrier deposition.

An appropriate first organic component for the first step is, for example, an organosilane according to the following general formula:

$$X_1 - \underset{\underset{Y_2}{|}}{\overset{\overset{Y_1}{|}}{Si}} - \left[ (B_1) - \underset{\underset{Z_2}{|}}{\overset{\overset{Z_1}{|}}{Si}} \right]_{n_1} - X_2$$

in which:

$n_1$ is an integer greater than or equal to 1, each Si is a silicon atom;

$X_1$ is a functional group able to react with a surface hydroxyl site of the dielectric material, $Y_1$ is either:

$X_3$, which is a further functional group able to react with a surface hydroxyl site of the dielectric material, H, which is a hydrogen atom, or $R_1$, which is an organic apolar group;

$Y_2$ is either:

$X_4$, which is a further functional group able to react with a surface hydroxyl site of the dielectric material, H, which is a hydrogen atom, or $R_2$, which is an organic apolar group, $B_1$, the presence of which is optional, is a bridging group, $Z_1$ is either:

$R_3$, which is an organic apolar group,

H, which is a hydrogen atom, or $X_5$, which is a hydrolizable group, and $Z_2$ is either:

$R_4$, which is an organic apolar group,

H, which is a hydrogen atom, or $X_6$, which is a hydrolizable group; and $X_2$ is a hydrolizable group.

Some examples of first organosilanes according to the description include:

EXAMPLE 1

Strong Amino (Basic) Group for Dehydrating, and Weak Methoxy Group for Rehydrating Methanol Bi-product (Inert to Surface)

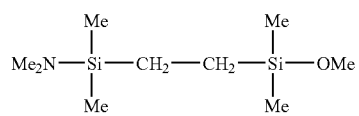

EXAMPLE 2

Increase the Efficiency of Steric Shielding by Additional Organic Groups

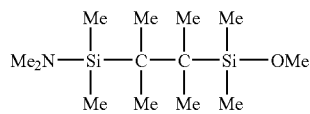

EXAMPLE 3

Silicon Backbone to Increase Thermal Stability

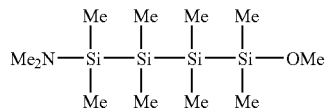

EXAMPLE 4

Aromatic Bridging Group to Increase Thermal Stability

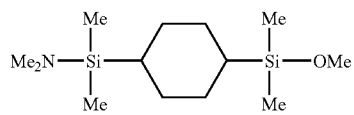

EXAMPLE 5

Strong Amino Hydrolyzable Groups on Both Ends—Amine (Basic) Product; Aromatic Bridging Group

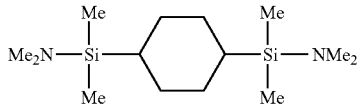

EXAMPLE 6

Strong Fluoromethenesulfonate Hydrolyzable Groups on Both Ends—Trifluorometanesulfanete (Acid) Product

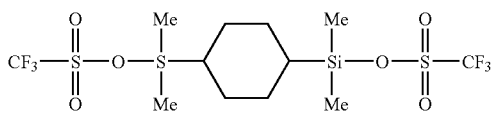

An appropriate component for the second step is an organosilane according to the general formula:

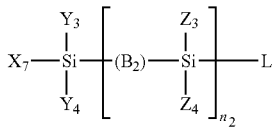

in which:

$n_2$ is an integer equal to or greater than or equal to 0, each Si is a silicon atom;

$X_7$ is a functional group able to react with a hydrolyzed functional group of the first organosilane molecule, $Y_3$ is either:
  $X_8$, which is a further functional group able to react with a hydrolyzed functional group of the first organosilane molecule,
  H, which is a hydrogen atom, or
  $R_5$, which is an organic apolar group;

$Y_4$ is either:
  $X_9$, which is a further functional group able to react with a hydrolyzed functional group of the first organosilane molecule,
  H, which is a hydrogen atom, or
  $R_6$, which is an organic apolar group, $B_2$, the presence of which is optional, is a bridging group, $Z_3$ is either:
  $R_7$, which is an organic apolar group,
  H, which is a hydrogen atom, or
  $L_1$, which is a ligand having an electron donor functionality and which is able to act as a metal nucleation site, $Z_4$ is either:
  $R_8$, which is an organic apolar group,
  H, which is a hydrogen atom, or $L_2$, which is a ligand having an electron donor functionality and which is able to act as a metal nucleation site, and L is a ligand having an electron donor functionality and is able to act as a metal nucleation site, Some examples of second organosilanes according to the description include:

EXAMPLE 1

Strong Amino (Basic) Group for Coupling, and Vinyl Ligand for Nucleation

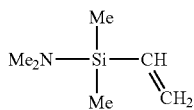

EXAMPLE 2

Alternative Acidic Fluoromethenesulfonate Coupling Group

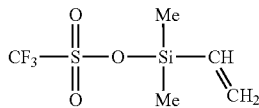

EXAMPLE 3

Alternative Acetylenyl Ligand

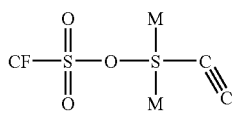

In view of the foregoing, an example of a process sequence according to the present invention includes (see FIG. 1):

passivating the dielectric layer (for example, by controlled atmosphere spraying or vapor phase deposition) (step S10);

aqueous via cleaning in which the cleaning solution contains a dipodal silane component (such as the first organosilanes described above) (can be done in liquid phase, controlled atmosphere spray, or vapor phase) (step S20);

optionally protecting a metallic layer (such as a copper cap layer) in the device structure to deter or at least weaken bonds between the passivating coupling material and the metallic layer, as described above (in a controlled atmosphere, or in vapor phase) (step S30);

applying a second organosilane component (for example, in liquid phase, in spray form (optionally using an organic solvent), or in vapor phase; may include ultraviolet drying assist) (step S40);

curing (for example, thermal) and/or baking in a controlled atmosphere (step S50); and electroless metal barrier layer deposition (for example, sidewall barrier layer deposition) in liquid phase (for example, using immersion (such as in bath), or spray) (step S60).

Once the porous dielectric material is appropriately passivated with the passivating coupling material (whether in a single step, or in multiple steps), metallization can be performed thereafter in liquid phase starting with an electroless deposition (as known, for example, from Shacham-Diamand, *Electroch. Acta*, vol. 44 (1999), 3639). After electroless deposition of a metallic barrier or seed layer in this fashion, a copper film can be deposited thereon by conventional electrodeposition or electroless deposition, as is known in the field of semiconductor manufacture.

The liquid phase barrier metal deposition can be, for example, by seeding the nucleation sites (i.e., the ligands) presented by the passivating coupling material as described and claimed herein using liquid metal precursors or liquid metal salts, in a manner well known in the field of metal deposition. The composition of the alloy needs to be tailored to obtain satisfactory barrier properties in the resultant sidewall barrier.

In an alternative process (also applicable to porous dielectrics), aqueous via cleaning following passivation, as mentioned above, could be replaced by an initial step of via cleaning using supercritical $CO_2$. This would be followed by a step of depositing a first organosilane component as described above, then a step of hydrating the structure to obtain distal hydroxyl sites on the first organosilane molecules (that is, to hydrolyze at least some of the terminal functional groups of the first organosilane). The thusly modified first organosilane can then be reacted with one of the second organosilanes described above. Electroless barrier deposition and electroless or electrodeposition of copper would then follow as already described.

In yet another alternative process (applicable to a conventional PTEOS $SiO_2$ dielectric), a conventional aqueous via cleaning is first performed. Then, the first organosilane as described above is applied using suitable methods (such as liquid phase deposition, spray, or vapor phase deposition). The structure is then hydrated in an aqueous media to obtain surface hydroxyls at the ends of the first organosilanes formed on the dielectric layer structure. A second organosilane is then deposited as described above so as to react with the surface hydroxyls presented by the first organosilane, and is then followed by electroless barrier layer deposition and electroless or electrodeposition of copper.

Although the present invention has been described above with reference to certain particular preferred embodiments, it is to be understood that the invention is not limited by reference to the specific details of those preferred embodiments. More specifically, the person skilled in the art will readily appreciate that modifications and developments can be made in the preferred embodiments without departing from the scope of the invention as defined in the accompanying claims.

The invention claimed is:

1. A passivating coupling material for passivating a dielectric material and for facilitating metal deposition on such a passivated dielectric material, wherein the passivating coupling material comprises:

a first organosilane having the general formula:

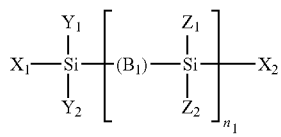

in which:

$n_1$ is an integer greater than or equal to 1, each Si is a silicon atom;

$X_1$ is a functional group able to react with a surface hydroxyl site of the dielectric material, $Y_1$ is either:
$X_3$, which is a further functional group able to react with a surface hydroxyl site of the dielectric material,
H, which is a hydrogen atom, or
$R_1$, which is an organic apolar group;

$Y_2$ is either:
$X_4$, which is a further functional group able to react with a surface hydroxyl site of the dielectric material,
H, which is a hydrogen atom, or
$R_2$, which is an organic apolar group, $B_1$, the presence of which is optional, is a bridging group, $Z_1$ is either:
$R_3$, which is an organic apolar group,
H, which is a hydrogen atom, or
$X_5$, which is a hydrolizable functional group, $Z_2$ is either:
$R_4$, which is an organic apolar group,
H, which is a hydrogen atom, or
$X_6$, which is a hydrolizable functional group; and $X_2$ is a hydrolizable functional group; and a second organosilane having a functional group able to react with a hydrolyzed functional group of the first organosilane, and a ligand for providing a metal nucleation site, the second organosilane having the general formula:

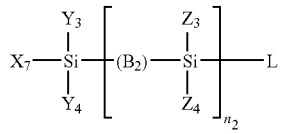

in which:

$n_2$ is an integer equal to or greater than or equal to 0, each Si is a silicon atom;

$X_7$ is a functional group able to react with a hydrolyzed functional group of the first organosilane molecule, $Y_3$ is either:
$X_8$, which is a further functional group able to react with a hydrolyzed functional group of the first organosilane molecule,
H, which is a hydrogen atom, or
$R_5$, which is an organic apolar group;

$Y_4$ is either:
$X_9$, which is a further functional group able to react with a hydrolyzed functional group of the first organosilane molecule,
H, which is a hydrogen atom, or
$R_6$, which is an organic apolar group, $B_2$, the presence of which is optional, is a bridging group, $Z_3$ is either:
$R_7$, which is an organic apolar group,
H, which is a hydrogen atom, or
$L_1$, which is a ligand having an electron donor functionality and which is able to act as a metal nucleation site, $Z_4$ is either:
$R_8$, which is an organic apolar group,
H, which is a hydrogen atom, or
$L_2$, which is a ligand having an electron donor functionality and which is able to act as a metal nucleation site, and L is a ligand having an electron donor functionality and is able to act as a metal nucleation site, wherein the first and second organosilanes together constitute a composition providing metal nucleation sites that promote electroless metal deposition.

2. A material according to claim 1, wherein at least one of $Z_1$ and $Z_2$ of the first organosilane is, respectively, $R_3$ and $R_4$.

3. A material according to claim 1, wherein $X_1$ and $X_7$ and, if present, $X_3$ and/or $X_4$ and/or $X_8$ and/or $X_9$, are selected from the group consisting of: -chloride, -bromide, iodine, acryloxy-, alkoxy-, acetamido, acetyl-, allyl-, amino-, cyano-, epoxy-, imidazolyl, mercapto-, methanosulfonato-, sulfonato-, triflouroacetamido, and urea-containing groups.

4. A material according to claim 1, wherein $B_1$ and/or $B_2$ is a silylene or a carbene group.

5. A method of forming a passivating coupling layer according to claim 1 on a dielectric layer having hydroxyl groups on a surface thereof, the method comprising:

depositing the first organosilane on the dielectric layer and permitting at least the functional group $X_1$ to react with a respective hydroxyl group of the dielectric material;

hydrolyzing at least the hydrolizable functional group $X_2$ of the first organosilane; and depositing the second organosilane and permitting at least the functional group $X_7$ to react with and bind to at least the hydrolyzed functional group $X_2$ of the first organosilane, whereby at least the ligand L of the second organosilane is available to act as a metal nucleation site.

6. A semiconductor device comprising:

a substrate; and a passivated dielectric layer formed on the substrate, wherein the dielectric layer is passivated with a passivating coupling material according to claim 1.

7. A semiconductor device according to claim 6, wherein the dielectric layer is porous.

8. A semiconductor device according to claim 7, wherein the porous dielectric layer is made from any one of carbonated silicon dioxide, tetraethylorthosilicate glass, and fluorine-doped tetraethylorthosilicate glass.

9. A semiconductor device according to claim 6 wherein it further comprises a metal layer formed on the passivated dielectric layer.

10. A method of manufacturing a semiconductor device comprising:
   forming a dielectric layer on a substrate; and
   passivating the dielectric layer according to the method of claim 5.

11. A method of claim 10, wherein the dielectric layer is a porous material, wherein the passivating coupling material functions to seal a porosity of the porous dielectric layer so as to retard the uptake of moisture into the porous dielectric layer.

12. A method according to claim 11, wherein the dielectric layer is made from any one of carbonated silicon dioxide, tetraethylorthosilicate glass, and fluorine-doped tetraethylorthosilicate glass.

13. A method according to claim 10, further comprising forming a metal layer on the passivated dielectric layer using a liquid-phase metal deposition process.

14. A method according to claim 13, wherein forming a metal layer on the passivated dielectric layer comprises a liquid-phase metal deposition process performed at a temperature of less than about 80° C.

15. A method according to claim 10, wherein passivating the dielectric layer comprises applying an aqueous solution containing the first organosilane on the surface of the dielectric layer.

16. A method according to claim 15, wherein passivating the dielectric layer comprises reacting at least the functional group $X_1$ of the first organosilane contained in the aqueous solution faster than the dielectric material can adsorb water.

17. A method according to claim 10, wherein at least one of the first and second organosilanes is applied in a gas phase.

18. A method according to claim 10, wherein the at least one of the first and second organosilanes is combined with a carrier gas.

19. A method according to claim 10, wherein at least one of the first and second organosilianes is applied as a spray in a predetermined atmosphere.

20. A method according to claim 19, wherein the predetermine atmosphere is an inert atmosphere.

* * * * *